United States Patent
Sprenger et al.

(10) Patent No.: US 7,255,740 B2
(45) Date of Patent: Aug. 14, 2007

(54) METHOD OF GROWING HEXAGONAL SINGLE CRYSTALS AND USE OF SAME AS SUBSTRATES FOR SEMICONDUCTOR ELEMENTS

(75) Inventors: Dirk Sprenger, Stadecken-Elsheim (DE); Burkhard Speit, Mainz (DE); Markus Schweizer, Klein-Winternheim (DE)

(73) Assignee: Schott AG, Mainz (DE)

( * ) Notice: Subject to any disclaimer, the term of this patent is extended or adjusted under 35 U.S.C. 154(b) by 115 days.

(21) Appl. No.: 10/781,094

(22) Filed: Feb. 17, 2004

(65) Prior Publication Data

US 2004/0177802 A1    Sep. 16, 2004

(30) Foreign Application Priority Data

Feb. 18, 2003 (DE) ............... 103 06 801
Mar. 6, 2003 (DE) ............... 103 09 863

(51) Int. Cl.
*C30B 13/02* (2006.01)

(52) U.S. Cl. ............... 117/13; 117/14; 117/20; 117/940

(58) Field of Classification Search ............... 117/13, 117/14, 20, 944
See application file for complete search history.

(56) References Cited

U.S. PATENT DOCUMENTS

| | | | | |
|---|---|---|---|---|
| 3,608,050 A * | 9/1971 | Carman et al. | ............... | 117/83 |
| 3,715,194 A * | 2/1973 | Plooster | ............... | 117/30 |
| 4,587,035 A * | 5/1986 | Kokta | ............... | 252/301.4 F |
| 4,595,598 A * | 6/1986 | De Luca et al. | ............... | 433/10 |
| 4,932,865 A * | 6/1990 | Collins et al. | ............... | 433/8 |
| 5,066,225 A * | 11/1991 | Jones et al. | ............... | 433/8 |
| 5,109,586 A * | 5/1992 | Jones et al. | ............... | 29/896.11 |
| 5,431,124 A | 7/1995 | Machida et al. | | |
| 6,811,607 B2 * | 11/2004 | Akselrod | ............... | 117/19 |

FOREIGN PATENT DOCUMENTS

| | | |
|---|---|---|
| DE | 2 208 150 | 9/1973 |
| DE | 202 901 | 10/1983 |
| GB | 1 149 492 | 4/1969 |

OTHER PUBLICATIONS

K.I Schaffers et al: "Progress in the Growth of YB . . . " Journal of Crystal Growth 225, 2001, pp. 449-453.

* cited by examiner

*Primary Examiner*—Robert Kunemund
(74) *Attorney, Agent, or Firm*—Michael J. Striker

(57) ABSTRACT

A method is described for making low-stress single crystals with a hexagonal crystal structure, which has a crystallographic c-axis perpendicular to a [0001] surface. A single crystal maintained at a temperature under the melting point of the crystal raw material is dipped in a melt of the crystal raw material, whereby a solid-liquid phase boundary is formed. The crystal is subsequently drawn with an upwardly directed drawing motion e.g. by the Czochralski method. The method is characterized by drawing the crystal along the c-axis so that a temperature gradient of at least 30 K/cm is present in the crystal within a centimeter of the solid-liquid phase boundary and by subsequently performing a tempering treatment on the resulting single crystal. The method is especially suitable for corundum crystals, such as sapphire, which are used as substrates for semiconductor components, such as LEDs.

33 Claims, 4 Drawing Sheets

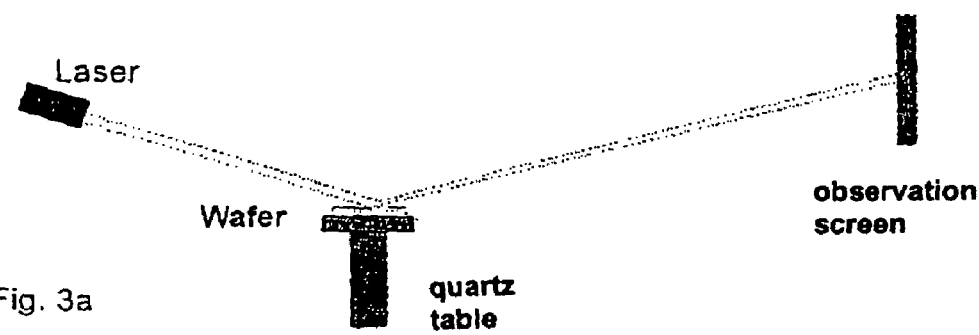
Fig. 3a
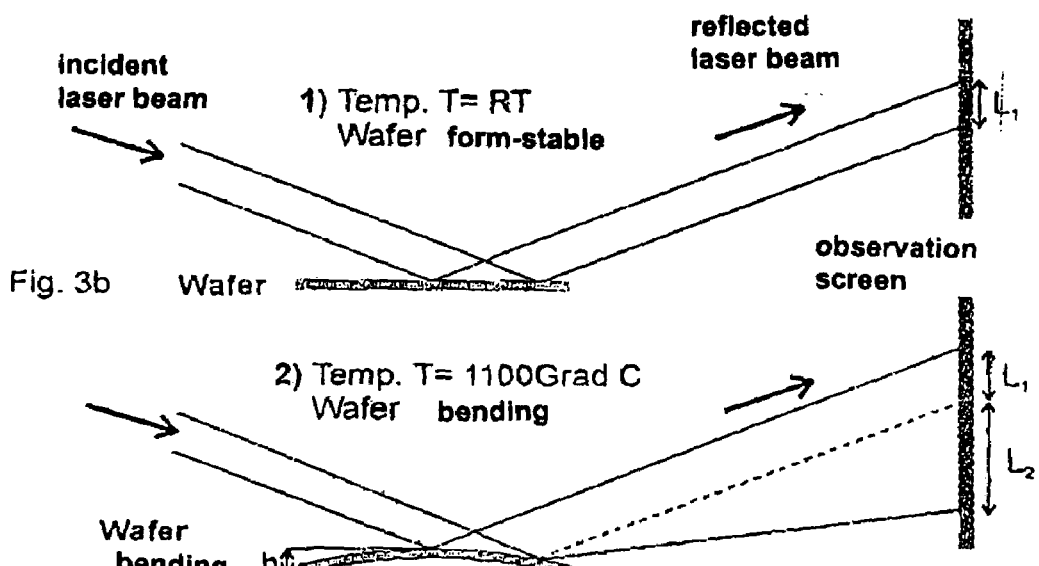
Fig. 3b
Fig. 3c

METHOD OF GROWING HEXAGONAL SINGLE CRYSTALS AND USE OF SAME AS SUBSTRATES FOR SEMICONDUCTOR ELEMENTS

BACKGROUND OF THE INVENTION

1. The Field of the Invention

The present invention relates to a method of making low-strain or strain-poor single crystals with a hexagonal structure, especially corundum single crystals, by the Czochralski method and a subsequent tempering process, to the low-stress single crystals themselves obtained by the method, and to their use for making electronic and electrical components.

2. Description of the Related Art

The manufacture of III-nitride semiconductor elements has made the development of many electronic components for high temperature engineering and high-energy engineering, such as laser applications, possible. Above all blue and white light emitting diodes (LED) that produce high light intensity were made possible by these elements, also their mass production. The principal problem with this is sufficient availability of suitable substrate material. A suitable substrate must, above all, have a high transparency and a sufficient resistance to corrosive action during manufacture of semiconductor structural elements. It must have sufficient form-stability at temperatures above 1300 K, in order to permit a uniform semiconductor layer growth.

Thermal properties, such as thermal expansion and heat conduction, must similarly have suitable values. Moreover a so-called mismatch between the crystal lattice of the substrate and the crystal lattice of the crystalline gallium nitride layer must be as small as possible, so that the gallium nitride layer can be epitaxially applied to the substrate. Currently sapphire is used as the substrate. The physical properties of sapphire are close to those of GaN and other semi-conductor variants used with it, such as AIN, GaN, InGaN or InGaAl. So-called wafers are used as substrates. They are thin substrate disks with diameters of a few inches (2 to 4"). The smallest mismatch between sapphire and GaN results, when wafers with a <0001> orientation are used as substrates. The mismatch of the lattice constants of the sapphire in relation to the GaN is minimal with this <0001> orientation. In this <0001> orientation the [0001] surface is the wafer surface and the crystallographic c-axis is perpendicular to the wafer surface.

The so-called Czochralski method, in which a seed crystal is immersed in melted raw material and slowly drawn from this melted raw material, is a suitable method in wide spread use for sapphire growth. This Czochralski method has the advantage that a true crystal growth and thus an ordered structure is possible in contrast to other known crystal growth methods. It is generally problematical that a single crystal of high quality can only be made by the Czochralski method when the seed crystal is withdrawn from the melted raw material parallel to the crystallographic m-direction of the sapphire. This m-direction is oriented at an angle of 90 degrees with respect to the c-axis. A crystal growth also partially occurs according to the Czochralski method, when the drawing direction is oriented at an angle of 60° to the c-axis (r-direction). In this case it is disadvantageous that the desired wafer in the <0001> orientation must be costly obliquely cut out from the thus grown single crystal. This reduces the yield and requires great processing effort in sapphire because of its great hardness. Moreover the wafer so obtained has unsymmetrical relaxation behavior of the intrinsic stress and thus an unsymmetrical deformation of the wafer during subsequent temperature treatment. This behavior reveals itself as interference with later epitaxial growth process, for example growth of GaN on the wafer. It is due to the high temperatures occurring during epitaxial growth processes and thus causes the wafer to deviate from its required planarity. In the Czochralski method in which the crystal is drawn in the m-direction a comparatively great material waste measured in broken crystal volume in comparison to the obtained wafer surface area results. Also the wafer quality is disadvantageously influenced by deformation as a result of stress relaxation at temperatures above 1270 K. The deformation by stress relaxation reveals itself already during the grinding and polishing processes during manufacture of the wafer.

Up to now good results regarding crystal quality could not be obtained with the Czochralski method in the c-axis direction because the growing speed must be minimized according to the axial temperature gradient at the phase boundary. Also no economical manufacture of sapphire crystals was possible according to this process generally on account of the limited growing speed. The poor material quality was largely due to the fact that the growth occurred at the atomic smooth [0001] surface. However flaws arise already on this surface with only very little surface energy in this crystal system. Small angle grain boundaries also arise making the substrate material unusable for high quality electronic components.

The manufacture of as-uniform-as-possible stress-free oxidic single crystals is described in DD-A 202 901. A very flat temperature gradient is set in the entire growth chamber in a high frequency heating system. However it has been shown that this method is not suitable for mass produced products, such as substrates for semiconductor elements.

SUMMARY OF THE INVENTION

It is an object of the present invention to provide a method, with which single crystals may be made simply and in high yield, from which a single crystal substrate with a <0001> orientation may be later obtained economically and in high quality, especially a stress-poor or low-stress high quality single crystal.

The method according to the invention for making a low-stress or stress-poor single crystal with a hexagonal crystal structure, which has a crystallographic c-axis perpendicular to a [0001] surface, from a melt of a crystal raw material, comprises the steps of:

a) dipping a single crystal in this melt so that a solid-liquid phase boundary is formed while keeping the single crystal at a temperature below a melting point of the crystal raw material;

b) withdrawing the single crystal from the melt by drawing upward with an upwardly directed drawing motion along the crystallographic c-axis so that a temperature gradient of at least 30 K/cm is present in the single crystal within 1 cm of the solid-liquid phase boundary in order to grow the single crystal; and then c) subjecting the single crystal produced in step b) to a tempering treatment.

It has been surprisingly shown that when the axial temperature gradient in the γ phase boundary region (about 1 cm in the growing crystal up to the melt) is adjusted to at least 30 K/cm in methods of crystal growth of the above-described kinds, growth speeds of at least 40 mm/day are obtained and the single crystal is subjected to a tempering treatment with preferably minimal radially symmetric temperature gradients with an especially small axial gradient.

The crystal growth is performed according to the invention along the crystallographic c-axis. It has been shown that the growth must occur preferably with a deviation of less than 5° from the c-axis. The deviation however especially should amount to less than 2.5°. However the crystal is generally grown in a direction that is as close to the crystallographic c-direction as possible.

A convex phase boundary surface bulge is produced on the melt by the drawing speed, the large temperature gradient in the crystal within a centimeter of the phase boundary and only by the rotation speed affecting the phase boundary shape between the crystal and the liquid melt. The phase boundary surface bulge generally has a radius of at least 0.05 m, especially at least 0.2 m.

The invention is based on the knowledge that the so-called anisotropic stress states of the wafer are responsible for deformation of a single crystal made by the Czochralski method and the wafer obtained from it in the conventional m-direction or r-direction during the subsequent temperature treatment. Indeed radially symmetric stresses are built in during growth in the m-direction or r-direction because of the radially symmetric temperature profile in the crystal. However this causes non-radially symmetric stress formation during oblique cleavage of the c-axis oriented crystals. The stress lines extend from one end of the wafer to the other. These anisotropic stress states in the crystal can never completely relax in a tempering process, so that wafer deformations occur in each subsequent temperature treatment process.

These anisotropic stress states are not present in wafers, which are made from single crystals made by the method according to the invention, since the crystals are grown in a radially symmetric temperature field. Of course similar stresses are built into the single crystal because of the axial temperature gradient. However these latter stresses are only rotationally symmetric and surprisingly may be more strongly reduced in the subsequent tempering treatment than the corresponding materials made according to the state of the art.

It has been shown that hexagonal single crystals can be drawn especially rapidly with the method according to the invention so that drawing speeds of at least 30 mm/day, especially at least 40 mm/day are possible. In many cases a maximum drawing speed of 200 mm/day has proven suitable. Usually however the maximum growing speed amounts to 150 mm/day, preferably a maximum speed of 130 mm/day, and particularly preferably 120 mm/day. An economical manufacture of especially low-stress or stress-poor single crystals is possible because of the increased growing speeds of the method according to the invention.

The temperature treatment and/or tempering can be performed in an after-heating zone in the apparatus above the crystal-growing vessel after the growing process. The single crystal may be simply introduced or fed into this after-heating region. It has proven advantageous when the single crystal is treated in a heat treatment for a time interval of at least one hour, preferably of at least two hours, isothermally and/or at a treatment temperature of at least 1750 K.

Preferably an axial temperature gradient should be adjusted in relation to the c-axis during growth of the crystal, in the crystal in the region of the phase boundary surface, i.e. within the first centimeter between the phase boundary and the already manufactured single crystal, to at least 30 K/cm. Preferred values are at least 35 K/cm and especially at least 40 K/cm, with 50 K/cm being most preferred. A preferred maximum gradient amounts to 200 K/cm, especially 150 K/cm.

No completely stress-free single crystals may be produced with these temperature gradients, however the stress state is uniformly radially symmetric. It can be nearly completely isotropically relaxed according the invention by the subsequent tempering process in a temperature range of 200 to 500 K less than that of the growth process at about 2320 K with a small axial and/or radial temperature gradient in relation to the c-axis.

The setting of the rotationally symmetric and/or axial temperature gradient constant over the entire length of the single crystal should be considered at least in the temperature treatment of the crystal in a growing apparatus in a subsequent thermal processing. This constant temperature gradient reduces the anisotropic stresses in the single crystal.

In an especially preferred embodiment the temperature during the tempering or the heat treatment can be changed stepwise or linearly. During stepwise change of the temperature for example pause intervals can be introduced, e.g. at 1400±25 K and/or 1000±25 K, in the phase transition of metastable states γ and η to the thermodynamically stable α form of sapphire. The pause intervals are each at least one 1 hour, preferably 2 hours.

In an additional embodiment of the method according to the invention a two-step temperature treatment is performed. It comprises a first treatment step, in which the single crystal is cooled with a first cooling rate from a first treatment temperature, and a second treatment step. In the second treatment step the single crystal, or a product made from it, is cooled with a second smaller cooling rate from a second treatment temperature. The first and faster, however controlled, cooling step followed by a second treatment step, which comprises slower cooling, has proven to be very important.

The single crystal can be cooled isothermally in the after-heating zone with the first treatment step. This may be easily accomplished after the manufacture of the single crystal.

In a preferred embodiment the single crystal is cooled down in a first treatment step with a cooling rate of preferably at maximum 50 K per hour, especially less than 20 K per hour, after growing it in a growth oven. After this comparatively rapid but controlled cool down the stresses in the already low-stress single crystal may be further reduced in a second treatment step.

The first treatment temperature or the single treatment temperature in the case of a one-step process preferably amounts to 2100 K. Especially the deviation amounts to at maximum ±50 K. The stress states relax especially well at this temperature.

In the second treatment step the single crystal should be cooled down with a cooling rate of less than 15 K per hour. This slower cool-down takes into consideration the larger volume of a complete crystal in comparison to a wafer made from it with a thickness of less than 1 mm. It assists the formation of a largely stress-free single crystal without deformation effects.

In another advantageous embodiment a crystal cooled in the growing unit or in a subsequent temperature process is finished to form an initial or intermediate product for a wafer. This initial or intermediate product has a material thickness of less than 1 mm and then is subjected to a second temperature treatment with a cooling rate of less than 20 K per hour with a treatment temperature of at most 2100 K and at minimum 1850 K. Because of that the wafer made with the method according to the invention is usually nearly stress-free and thus has a stable form or shape during subsequent temperature processing, such as LED applications.

The method with the features according to the invention with temperature treatments should be performed after the growing process above the melt vessel under a protecting gas, such as $N_2$ or Ar, or in vacuum for protection of the noble metal vessel from oxidation in a temperature range above 1950 K. Both impurities and undefined heat conduction effects, and thus crystal defects, may largely be avoided.

In a preferred embodiment of the invention a predetermined surrounding pressure approximately equal to standard pressure with oxygen content of up 50 percent is provided outside of the growing unit at a treatment temperature of at most 1950 K. Gas-contacting parts are made from a platinum-rhodium alloy, which requires an oxidizing atmosphere under these temperature conditions. In this way good results are obtained. The noble metal parts are necessary for fixing and/or supporting and/or protecting the tempered product in the oven.

In another embodiment of the invention, with which good results may be obtained, a predetermined surround pressure approximately equal to standard pressure is provided by means of an inert gas. In this embodiment gas-contacting parts are made from iridium. Argon, nitrogen or also a mixture of them can be used as the inert gas. The maximum oxygen content of the inert gas and/or mixture can amount to at most 2% because of the oxygen sensitivity of the iridium.

In a third embodiment a two step process comprising a combination of the foregoing two preferred embodiments, in which a complete gas exchange of the gas containing 50% oxygen with the inert gas required for the higher temperature range is performed prior to transition to the higher temperatures.

The method according to the invention is especially suitable for manufacture of corundum crystals, such as sapphire and ruby.

BRIEF DESCRIPTION OF THE SEVERAL VIEWS OF THE DRAWING

The objects, features and advantages of the invention will now be described in more detail with the aid of the following description of the preferred embodiments, with reference to the accompanying figures in which:

FIG. 3 is a diagrammatic cross-sectional view of an apparatus for measuring the bending of wafers.

DETAILED DESCRIPTION OF THE INVENTION

Figure 1:
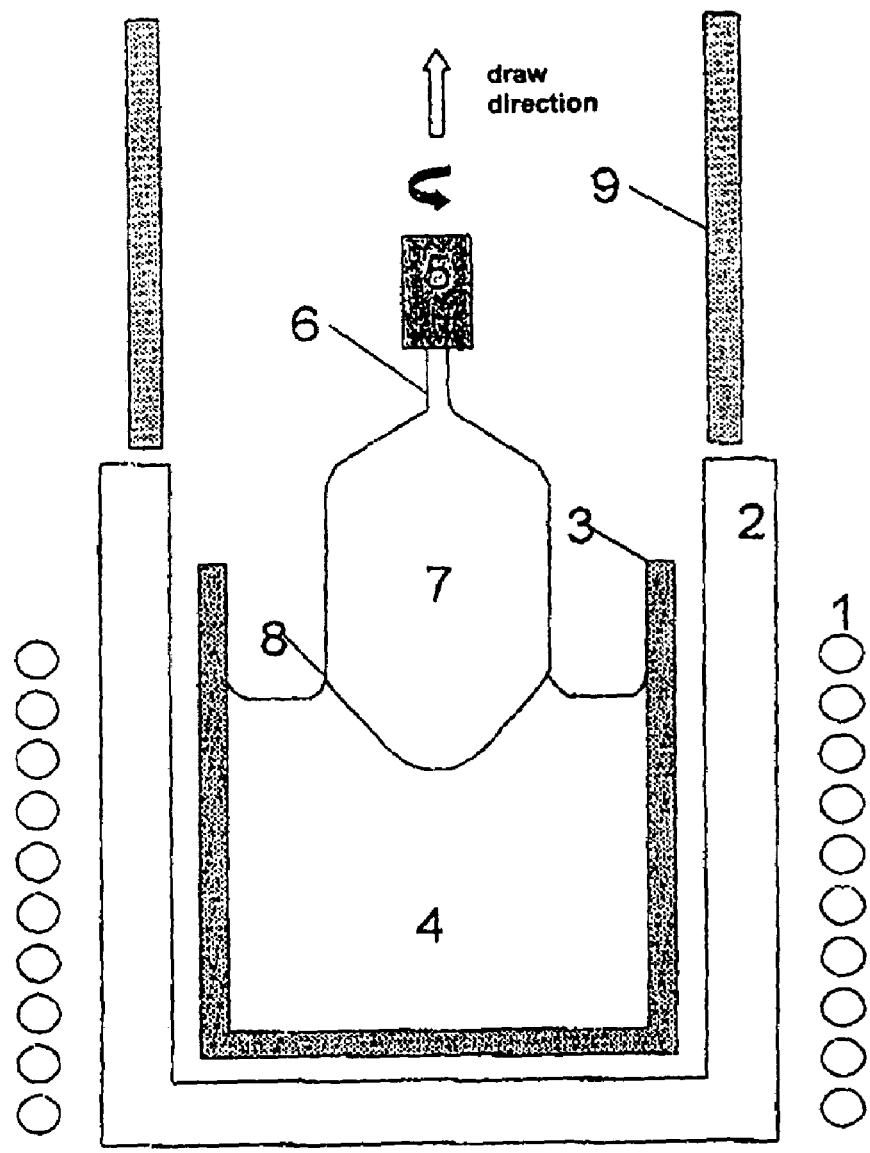
FIG. 1 is a diagrammatic cross-sectional view through an apparatus for growing a single crystal.

FIG. 1 is a diagrammatic view of an apparatus for performing the method. The apparatus has a heater 1 and a vessel 3, which is shielded off from the surroundings by a shield 2. The heater 1 is embodied as an induction heater in the apparatus shown in the figure. The screen 2 can act as a heat shield or also it can be inductively coupled to the induction coil 1 and because of that act as a heating means for indirect heating of the vessel 3. The vessel 3 can also be directly heated inductively by the induction coil 1.

The raw material 4, which is in the melted state because of the heating with the heater 1, is arranged in the vessel 3. Aluminum oxide 4 as raw material is arranged in the vessel 3 as a melt.

A crystal drawing rod 5 is arranged above the melt as shown in FIG. 1. This drawing rod 5 is drawn in the indicated direction with a gross drawing speed of more than 40 mm per day. At the same time the drawing rod is rotated about its own axis. Typically rotation speeds of the method according to the invention are between 10 and 40 revolutions per minute, so that the drawing rod is rotated with the crystal seed and the crystal body growing on it. Drive and control means for driving the drawing rod 5 and for control of the motion of the drawing rod are not shown in the figures.

A seed crystal 6, namely a sapphire single crystal, is arranged at the end of the drawing rod 5 closest to the vessel 3. The seed crystal 6 is oriented so that its crystallographic c-axis is facing or directed toward the melted raw material in the vessel. Particularly the crystallographic c-axis of the seed crystal 6 is directed vertically downward.

A single crystal 7, especially a sapphire single crystal 7, grows at the end of the seed crystal 6 facing the melted raw material 4. The single crystal 7 forms a phase boundary surface 8 with the melted raw material 4. Vessel, melt and drawing crystal are in a protective gas atmosphere of e.g. argon with a maximum oxygen content of less than 1% under normal pressure conditions.

During manufacture of a single crystal 7 with the apparatus shown in FIG. 1 first crystalline raw material 4, especially aluminum oxide, is introduced into the vessel 3 and melted by means of the heater 1. The seed crystal 6, preferably a corundum crystal, such as sapphire crystal, mounted on the end of the drawing rod 5 facing the melted raw material 4, is immersed in the melted raw material 4 and its diameter slowly grows. When the desired diameter is attained, the drawing rod is slowly drawn in the direction shown in FIG. 1 with a speed of about 40 to 120 mm per day and rotates in the direction indicated by the arrow about its own rotation axis with a rotation speed of from 10 to 40 revolutions per minute.

In the method according to the invention the crystals are grown in the unconventional c-axis direction for the growth of crystals with hexagonal structures. Moreover an unconventionally higher axial temperature gradient is present at the phase boundary surface for this method, which conventionally would cause stress increases in the crystals. However a high growing speed can nonetheless be obtained. The method according to the invention permits almost complete elimination of radially symmetric stresses in the crystals by a subsequent tempering process.

The entire method with a definite after-heating process, which is conducted either within the growing apparatus in after-heating zone 9 or according to choice in a subsequent tempering process outside of the crystal growing apparatus, leads surprisingly to single crystals with smaller stresses than those of the prior art. The low-stress or stress-poor single crystals according to the invention are outstandingly suitable as the above-described substrates.

Sapphire crystals may be grown with the above-described methods according to the invention, which must be only slightly larger in diameter than the wafers for subsequent coating processes, for example during manufacture of LEDs. When mechanical stresses are introduced by subsequent mechanical processing steps, such as cutting, lapping, grinding or polishing, of the thin substrates smaller than 1 mm thick, a subsequent temperature treatment according to example 1 or 2 is appropriate, in which however adjustments to smaller volumes take place. Smaller volume of the crystals or wafers allows shorter dwell times at fixed temperature levels for temperature equilibration and more rapid cooling times of less than 15 K per hour, without impairing the required prescribed maximum temperature gradient of less than 4 K per hour. Definitely planar and shape-stable wafers for subsequent high temperature processes, which can withstand the temperatures produced during the GaN coating process, may be produced by the above-described methods. These wafers also fulfill the requirement for reduced crystal defects during high temperature processing in the semiconductor industry. Particularly the planarity, which means the deviation of the wafer surface from an ideal plane, is improved by a factor of 2. The sapphire single crystals made according to the described methods with the features of the invention and the substrates produced from them are especially suitable for MOCVD coatings with III nitride semiconductors for making for example LEDs.

The invention is explained in further detail by means of the following examples, which should not be considered to limit any of the claimed subject matter in the following appended claims.

EXAMPLES

Example 1

A sapphire single crystal 7 is made in the previously described manner with a growth speed of 48 mm/day and an axial temperature gradient of 50 K/cm in the phase boundary region and under a protective gas atmosphere. Then this sapphire single crystal is isothermally cooled to the temperature of about 2100 K. The additional cooling of the sapphire single crystal occurs with a rate of 40 K per hour. Small angle grain boundaries are largely avoided in this way.

Subsequently wafers with <0001> orientation are made from the single crystal 7. These wafers are then heated up in an oven with parts made from platinum-rhodium alloy and in an oxygen air atmosphere with an oxygen content up to 50 percent at standard pressure and at a temperature of about 1950 K and cooled down with a cooling rate of 15 K per hour. A radial temperature gradient of less than 4 K per centimeter is maintained in the material during these two treatment steps.

Example 2

A sapphire single crystal 17 made according to example 1 is cooled down and divided into wafers. Subsequently the wafers are heated in an oven with iridium parts under an inert gas atmosphere at a temperature of about 2100 K and cooled down with a cooling rate of 15 K per hour at room temperature. The inert gas atmosphere comprises nitrogen, $N_2$, at standard pressure. The cooling is interrupted at 1400 K±25 K and/or 100 K±25 K when the phase transitions of the metastable states γ and η to the thermodynamically stable a form of sapphire associated with these temperatures take place. These temperatures are kept constant for two hours respectively prior to further cooling.

Example 3

A sapphire single crystal according to example 1 is made and cooled. The single crystal is subsequently heated up in an oven with iridium parts to a temperature of about 2100 K in an inert gas atmosphere, kept at constant temperature for 24 hours and cooled down to room temperature at a cooling rate of 10 K per hour. Here the larger volumes in contrast to those of the substrates must be considered during cool down of the raw crystal. The inert gas atmosphere comprises nitrogen, $N_2$, under standard pressure.

The different stress levels of the sapphire material caused by the manufacturing process for the wafer from the raw crystal may be quantitatively and locally determined with the subsequently described methods. In addition to the measurements performed here stresses in the crystals and/or wafers can be determined in a depth selective manner by Raman spectroscopy and by X-ray diffraction.

Example 4

The stress-dependent path differences were determined by laser measurement methods.

To evaluate the material quality of the grown sapphire raw crystals made according to example 3 stress birefringence measurements on volumetric samples (Boule cylinder: diameter: 2"; height 40 mm) of the crystal were performed to determine quality of the crystals. The measurement results were compared with similar results for state of the art crystals. The measurement method that was used was based on measurement of the path difference (given in nm) between two orthogonal components of a definitely polarized laser beam (wavelength=672 nm). The stress difference value, $\Delta\sigma = \rho_1 - \sigma_2$, is proportion to this path difference.

The observed measurement signal is the result of integration of all lateral stress components along the irradiated cylinder height. One must consider that the measure path difference (measured variable) is to be normalized to the length of the irradiated crystal segment. Data acquisition occurs by a linear scan, which is performed along a straight radial line through the center point of the crystal cylinder. This method is described, e.g., in the textbook, H. Aben, C. Guillemet, *Photoelasticity of Glass*, Springer Verlag, 1993. The measurements were performed with a RPA 2000 measurement unit of Instruments Systems, Munich, Germany.

Figure 2:
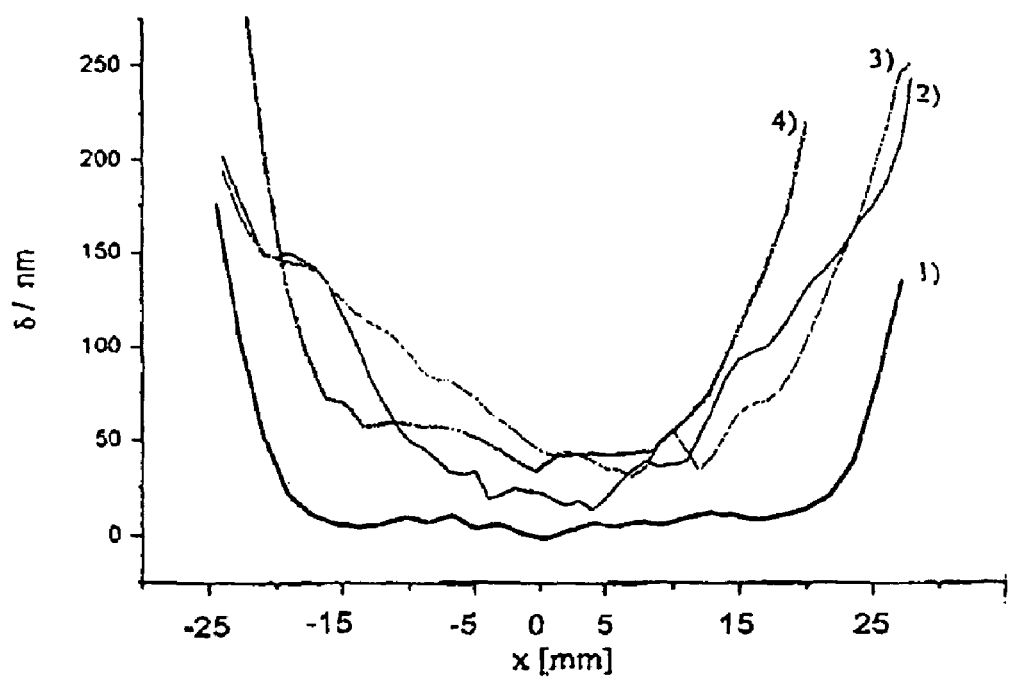
FIG. 2 is a graphical illustration of the stress birefringence of a single crystal as a function of distance from a crystal center axis for three prior art crystal samples and one crystal sample according to the invention.

The results shown in FIG. 2 are given as δ/nm as a function of distance from the center of the crystal sample. Three crystalline materials according to the state of the art A, B, C are compared with a crystal according to the invention (Example 3) in FIG. 2. The curve showing the measured results for the crystal sample according to the invention is numbered 1 in FIG. 2. The curves 2, 3 and 4 are for the state of the art crystal samples A, B and C respectively. Crystal sample A is a commercially obtainable crystal grown in the m-direction according to the Kyropoulos method. Crystal samples B and C are commercially obtainable and are grown in the m-direction (sample B) and in the redirection (sample C) according to the Czochralski method.

As can be seen from FIG. 2, only small stress differences occur in the crystal sample according to the invention. The center region of 5 to 45 mm essential for the manufacture of the semiconductor elements not only has low stress values, but the stress values are constant. In contrast the wafer according to the prior art A, B, C is characterized by clearly greater stresses (curves 2, 3 and 4). Also the stress curves for the prior art wafers are not radially symmetric because of the growth in the m-direction and redirection. Furthermore the stress curves of the prior art wafers are asymmetric and have a significant y-axis offset. The advantage of the sapphire crystals according to the invention regarding height and symmetry of the stress state in relation to the prior art is clearly observable from FIG. 2.

Example 5

Wafer deformation during heating was measured.

The bending or deformation of sapphire wafers was determined by laser reflection measurements. During these measurements the wafer is exposed to a temperature profile that is comparable to that used in a typical GaN coating process.

These measurements show how strongly the planarity and/or flatness of the substrate changes during a varying temperature profile. The deformation is a measure of the stress in the crystalline material. Because of the different growth and tempering processes for preparing the single crystals the substrates exhibit greatly different amounts of bending.

Each of the wafers to be tested is placed on a quartz table in an oven under reproducible conditions and irradiated from the side by a laser. A laser beam from the laser is divided into two laser beams by a beam splitter so that one laser beam is reflected from the center of each wafer tested and the other from a location near the edge of the tested wafer. The reflected laser beams strike a screen about 3 mm from the wafer and are observed on the screen. If the substrate bends, the spacing between the three laser reflection points changes and can be measured on the screen. The measuring apparatus is shown schematically in FIG. 3.

The wafers according to the invention were compared with the wafers of the prior art with this measuring apparatus. The results of the comparison are shown in FIG. 4.

Figure 4:
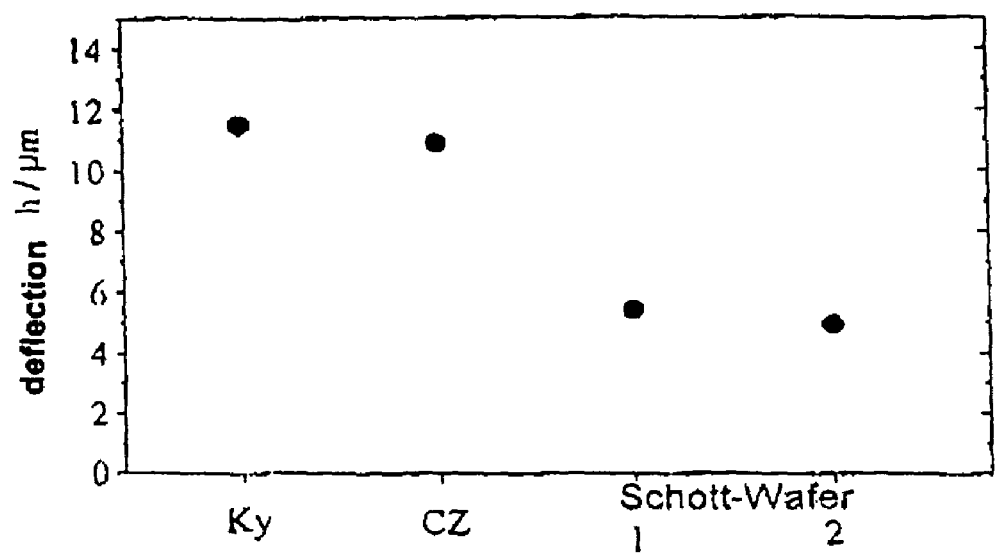
FIG. 4 is a graphical illustration showing the bending of wafers of the invention and wafers of the prior art.

The wafer designated Ky in FIG. 4 was made according to the Kyropoulos method by growing a single crystal in the m-direction. The water designated CZ was made according to the Czochralski method by growing a single crystal in the m-direction. The wafers designated 1 and 2 were made according to the methods described in examples 1 and 2 respectively.

The measurement results are shown in FIG. 4. As can be seen from FIG. 4, the maximum relative change of the laser reflection points in the crystals obtained according to the invention shows that clearly less bending occurs in those crystals than the crystals prepared according to the prior art. FIG. 4 clearly shows that the crystals grown in the m-direction have greater deformation when subjected to similar temperature profiles.

The measurements clearly show the different deformation stability of the wafers made according to the invention in comparison to those of the prior art. Deformations of at maximum 9 μm are tolerable, but deformations of at maximum 8 μm are preferred and 6 μm are particularly preferred. Usually deformations of the wafers according to the invention amount to 5 μm or less. Thus uniform III-nitride semiconductor coatings are guaranteed over the entire surface of a wafer with a 2 to 4 inch diameter by coating of a wafer on a hot plate at e.g. 1370 K.

The disclosures in German Patent Application 103 06 801.5 of Feb. 18, 2003 and 103 09 863.1 of Mar. 6, 2003 are incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a method of growing hexagonal single crystals and use of the single crystals as substrates for semiconductor elements, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method for making a low-stress or stress-poor single crystal with a hexagonal crystal structure, which has a crystallographic c-axis perpendicular to a [0001] surface, from a melt of a crystal raw material, said method comprising the steps of:
   a) dipping a single crystal in said melt so that a solid-liquid phase boundary is formed while keeping the single crystal at a temperature below a melting point of the crystal raw material;
   b) withdrawing said single crystal from the melt by drawing upward with an upwardly directed drawing motion along the crystallographic c-axis so that a temperature gradient of at least 30 K/cm is present in the single crystal within 1 cm of the solid-liquid phase boundary in order to grow the single crystal with the hexagonal crystal structure with the crystallographic c-axis; and then
   c) subjecting the single crystal produced in step b) to a tempering treatment.

2. The method as defined in claim 1, wherein during the tempering treatment the single crystal is heat-treated at a treatment temperature of at least 1750 K and/or isothermally for a time interval of at least one hour.

3. The method as defined in claim 1, wherein the drawing of the single crystal upward takes place with a drawing speed greater than 40 millimeters per day.

4. The method as defined in claim 1, further comprising cooling down the single crystal from a temperature of more than 1750 K to room temperature and adjusting at least one of an axial temperature gradient and radial temperature gradient to at maximum 4 K/cm during the cooling down.

5. The method as defined in claim 1, wherein during said tempering treatment the single crystal and/or a wafer obtained from the single crystal is heated up to temperatures of at least 1850 K and then cooled down with cooling rate of at maximum 20 K per hour to maintain a maximum permissible temperature gradient of 4 K/cm in an axial and/or radial direction.

6. The method as defined in claim 1, wherein a temperature of the single crystal is changed linearly and/or stepwise during the tempering treatment.

7. The method as defined in claim 1, wherein said tempering treatment comprises a two-step heat treatment and said two-step heat treatment has a first treatment step, in which the single crystal is cooled down at a first cooling rate from a first treatment temperature, and a second treatment step, in which the single crystal or a product made from the single crystal is cooled down at a second cooling rate that is smaller than the first cooling rate from a second treatment temperature.

8. The method as defined in claim 7, wherein the first cooling rate is less than 50 K per hour.

9. The method as defined in claim 7, wherein the first treatment temperature is 2100±50 K.

10. The method as defined in claim 1, wherein the crystal raw material is corundum, ruby or sapphire.

11. A low-stress or stress-poor hexagonal single crystal obtainable by a method comprising the steps of:
  a) dipping a single crystal in a melt of crystal raw material so that a solid-liquid phase boundary is formed while keeping the single crystal at a temperature below a melting point of the crystal raw material, said single crystal consisting of the crystal raw material in single crystal form with a hexagonal crystal structure with a crystallographic c-axis perpendicular to a [0001] surface;
  b) withdrawing said single crystal from the melt by drawing upward with an upwardly directed drawing motion along the crystallographic c-axis so that a temperature gradient of at least 30 K/cm is present in the single crystal within 1 cm of the solid-liquid phase boundary in order to grow the single crystal; and then
  c) subjecting the single crystal produced in step b) to a tempering treatment.

12. The hexagonal single crystal as defined in claim 11, wherein during the tempering treatment the single crystal is heat-treated at a treatment temperature of at least 1750 K and/or isothermally for a time interval of at least one hour.

13. The hexagonal single crystal as defined in claim 11, wherein the drawing of the single crystal upward takes place with a drawing speed greater than 40 millimeters per day.

14. The hexagonal single crystal as defined in claim 11, wherein the method comprises cooling down the single crystal from a temperature of more than 1750 K to room temperature and adjusting at least one of an axial temperature gradient and radial temperature gradient to at maximum 4 K/cm during the cooling down.

15. The hexagonal single crystal as defined in claim 11, wherein during said tempering treatment the single crystal and/or a wafer obtained from the single crystal is heated up to temperatures of at least 1850 K and then cooled down with cooling rate of at maximum 20 K per hour to maintain a maximum permissible temperature gradient of 4 K/cm in an axial and/or radial direction.

16. The hexagonal single crystal as defined in claim 11, wherein a temperature of the single crystal is changed linearly and/or stepwise during the tempering treatment.

17. The hexagonal single crystal as defined in claim 11, wherein said tempering treatment comprises a two-step heat treatment and said two-step heat treatment has a first treatment step, in which the single crystal is cooled down at a first cooling rate from a first treatment temperature, and a second treatment step, in which the single crystal or a product made from the single crystal is cooled down at a second cooling rate that is smaller than the first cooling rate from a second treatment temperature.

18. The hexagonal single crystal as defined in claim 17, wherein the first cooling rate is less than 50 K per hour.

19. The hexagonal single crystal as defined in claim 17, wherein the first treatment temperature is 2100±50 K.

20. The hexagonal single crystal as defined in claim 11, wherein the crystal raw material is corundum, ruby or sapphire.

21. A semiconductor element comprising a hexagonal single crystal, said hexagonal single crystal being obtainable by a method comprising the steps of:
  a) dipping a single crystal in a melt of crystal raw material so that a solid-liquid phase boundary is formed while keeping the single crystal at a temperature below a melting point of the crystal raw material, said single crystal consisting of the crystal raw material in single crystal form with a hexagonal crystal structure with a crystallographic c-axis perpendicular to a [0001] surface;
  b) withdrawing said single crystal from the melt by drawing upward with an upwardly directed drawing motion along the crystallographic c-axis so that a temperature gradient of at least 30 K/cm is present in the single crystal within 1 cm of the solid-liquid phase boundary in order to grow the single crystal; and then
  c) subjecting the single crystal produced in step b) to a tempering treatment.

22. The semiconductor element as defined in claim 21, wherein the crystal raw material is sapphire and further comprising a gallium nitride layer applied to a surface of said single crystal.

23. The semiconductor element as defined in claim 21, wherein the crystal raw material is sapphire and further comprising a layer applied to a surface of said single crystal, said layer comprising at least one coating material selected from the group consisting of GaN, AlN, InGaN and InGaAl.

24. The semiconductor element as defined in claim 21, wherein during the tempering treatment the single crystal is heat-treated at a treatment temperature of at least 1750 K and/or isothermally for a time interval of at least one hour.

25. The semiconductor element as defined in claim 21, wherein the drawing of the single crystal upward takes place with a drawing speed greater than 40 millimeters per day.

26. The semiconductor element as defined in claim 21, wherein the method comprises cooling down the single crystal from a temperature of more than 1750 K to room temperature and adjusting at least one of an axial temperature gradient and radial temperature gradient to at maximum 4 K/cm during the cooling down.

27. The semiconductor element as defined in claim 21, wherein during said tempering treatment the single crystal and/or a wafer obtained from the single crystal is heated to temperatures of at least 1850 K and then cooled down with cooling rate of at maximum 20 K per hour to maintain a maximum permissible temperature gradient of 4 K/cm in an axial and/or radial direction.

28. The semiconductor element as defined in claim 21, wherein a temperature of the single crystal is changed linearly and/or stepwise during the tempering treatment.

29. The semiconductor element as defined in claim 21, wherein said tempering treatment comprises a two-step heat treatment and said two-step heat treatment has a first treatment step, in which the single crystal is cooled down at a first cooling rate from a first treatment temperature, and a second treatment step, in which the single crystal or a product made from the single crystal is cooled down at a second cooling rate that is smaller than the first cooling rate from a second treatment temperature.

30. The semiconductor element as defined in claim 29, wherein the first cooling rate is less than 50 K per hour.

31. The semiconductor element as defined in claim 29, wherein the first treatment temperature is 2100±50 K.

32. A method of growing a low-stress or stress-poor single crystal with a hexagonal crystal structure, which has a crystallographic c-axis perpendicular to a [0001] surface, said method comprising the steps of:

a) providing a melt of a crystal raw material consisting of aluminum oxide;

b) dipping a single crystal into said melt, said single crystal consisting of corundum with a hexagonal crystal structure with a crystallographic c-axis perpendicular to a [0001] surface, so that a solid-liquid phase boundary is formed while keeping the single crystal at a temperature below a melting point of the crystal raw material;

c) withdrawing said single crystal with said hexagonal crystal structure from the melt by drawing upward with an upwardly directed drawing motion along the crystallographic c-axis at a drawing speed of 30 to 150 mm/day so that a temperature gradient of at least 30 K/cm is present in the single crystal within 1 cm of the solid-liquid phase boundary in order to grow the single crystal with the hexagonal crystal structure with said crystallographic c-axis; and then d) tempering said single crystal produced in step c) by heat-treating at a treatment temperature of at least 1850 K for at least one hour; and e) cooling down said single crystal with a cooling rate of at maximum 50 K/hr from said treatment temperature while adjusting at least one of an axial temperature gradient and radial temperature gradient to at maximum 4 K/cm during the cooling down;

so that said low-stress or stress-poor single crystal grown in a direction of said crystallographic c-axis has lower stress values than corundum single crystals grown in an in-direction or in an r-direction from said melt.

33. A low-stress or stress-poor single crystal of corundum grown by a method comprising the steps of:

a) providing a melt of a crystal raw material consisting of aluminum oxide;

b) dipping a single crystal into said melt, said single crystal consisting of corundum with a hexagonal crystal structure with a crystallographic c-axis perpendicular to a [0001] surface, so that a solid-liquid phase boundary is formed while keeping the single crystal at a temperature below a melting point of the crystal raw material;

c) withdrawing said single crystal from the melt by drawing upward with an upwardly directed drawing motion along the crystallographic c-axis at a drawing speed of 30 to 150 mm/day so that a temperature gradient of at least 30 K/cm is present in the single crystal within 1 cm of the solid-liquid phase boundary in order to grow the single crystal with the hexagonal crystal structure with said crystallographic c-axis; and then d) tempering said single crystal produced in step c) by heat-treating at a treatment temperature of at least 1850 K for at least one hour; and e) cooling down said single crystal with a cooling rate of at maximum 50 K/hr from said treatment temperature while adjusting at least one of an axial temperature gradient and radial temperature gradient to at maximum 4 K/cm during the cooling down;

so that said low-stress or stress-poor hexagonal single crystal of said corundum grown by said method in a direction of said crystallographic c-axis has lower stress values than corresponding corundum single crystals grown in an in-direction or in an r-direction from said melt.

* * * * *